(12) United States Patent
Krasowski et al.

(10) Patent No.: US 9,419,558 B2
(45) Date of Patent: Aug. 16, 2016

(54) METHOD AND APPARATUS FOR IN-SITU HEALTH MONITORING OF SOLAR CELLS IN SPACE

(75) Inventors: Michael J. Krasowski, Chagrin Falls, OH (US); Norman F. Prokop, Shaker Heights, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 13/448,801

(22) Filed: Apr. 17, 2012

(65) Prior Publication Data

US 2012/0256648 A1    Oct. 11, 2012

Related U.S. Application Data

(63) Continuation-in-part of application No. 12/570,742, filed on Sep. 30, 2009, now Pat. No. 8,159,238.

(51) Int. Cl.
| | |
|---|---|
| *G01R 27/08* | (2006.01) |
| *H02S 50/10* | (2014.01) |
| *G01R 31/40* | (2014.01) |
| *H02J 7/04* | (2006.01) |

(52) U.S. Cl.
CPC .............. *H02S 50/10* (2014.12); *G01R 31/405* (2013.01); *H02J 7/045* (2013.01)

(58) Field of Classification Search
CPC ................................ H02J 7/045; G01R 31/405
USPC ............. 324/713, 76.12, 76.13, 76.19, 76.22, 324/76.36; 318/16, 618; 338/174
See application file for complete search history.

(56) References Cited

U.S. PATENT DOCUMENTS

| | | | | |
|---|---|---|---|---|
| 4,129,823 | A * | 12/1978 | van der Pool et al. | ... 324/761.01 |
| 4,163,194 | A * | 7/1979 | Ross | ............ 324/761.01 |
| 4,184,111 | A * | 1/1980 | Lovelace et al. | ............ 324/404 |
| 4,556,840 | A * | 12/1985 | Russell | ............ G01R 31/2818 714/734 |
| 4,706,010 | A * | 11/1987 | Callen et al. | ............ 323/225 |
| 4,711,024 | A * | 12/1987 | Russell | ............ G01R 31/28 29/832 |
| 6,271,024 | B1 * | 8/2001 | Sve et al. | ............ 435/303.1 |
| 6,837,182 | B2 * | 1/2005 | Leblanc | ............ 119/220 |
| 2003/0112072 | A1 * | 6/2003 | Kim | ............ 330/254 |
| 2004/0004577 | A1 * | 1/2004 | Forster | ............ 343/866 |
| 2005/0099159 | A1 * | 5/2005 | Ishida | ............ H02J 7/045 320/128 |

* cited by examiner

*Primary Examiner* — Huy Q Phan
*Assistant Examiner* — Temilade Rhodes-Vivour
(74) *Attorney, Agent, or Firm* — Robert H. Earp, III

(57) ABSTRACT

Embodiments of the present invention describe an apparatus including an oscillator, a ramp generator, and an inverter. The oscillator is configured to generate a waveform comprising a low time and a high time. The inverter is configured to receive the waveform generated by the oscillator, and invert the waveform. The ramp generator is configured to increase a gate control voltage of a transistor connected to a solar cell, and rapidly decrease the gate control voltage of the transistor. During the low time, a measurement of a current and a voltage of the solar cell is performed. During the high time, a measurement of a current of a shorted cell and a voltage reference is performed.

7 Claims, 6 Drawing Sheets

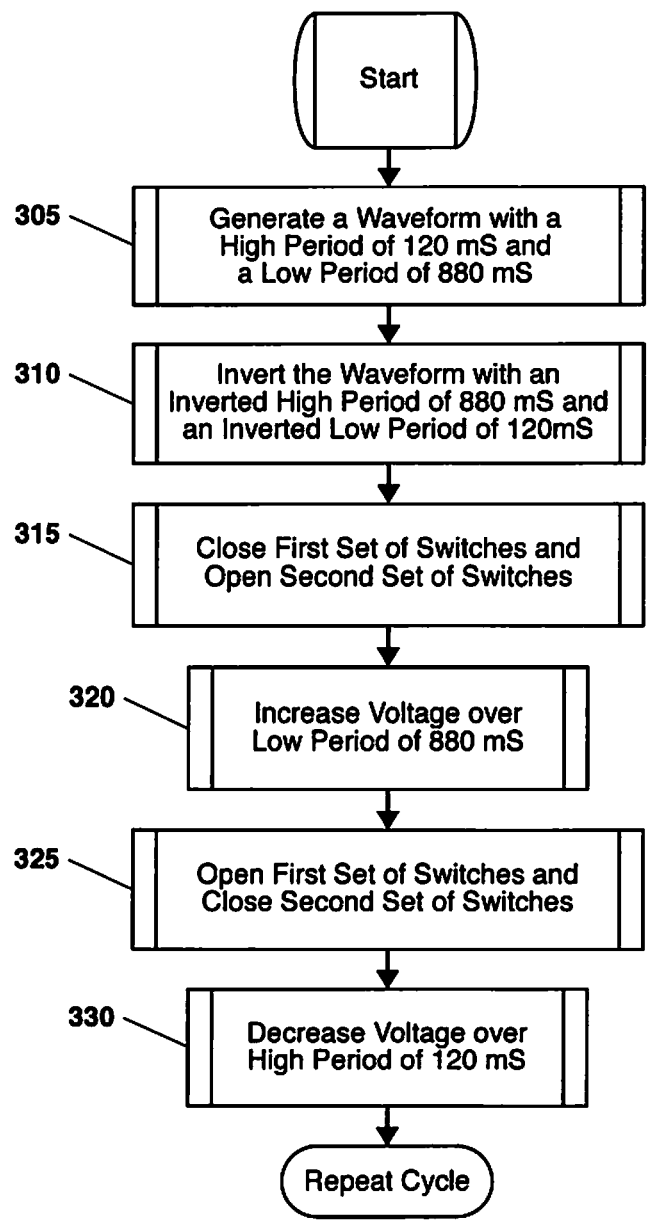

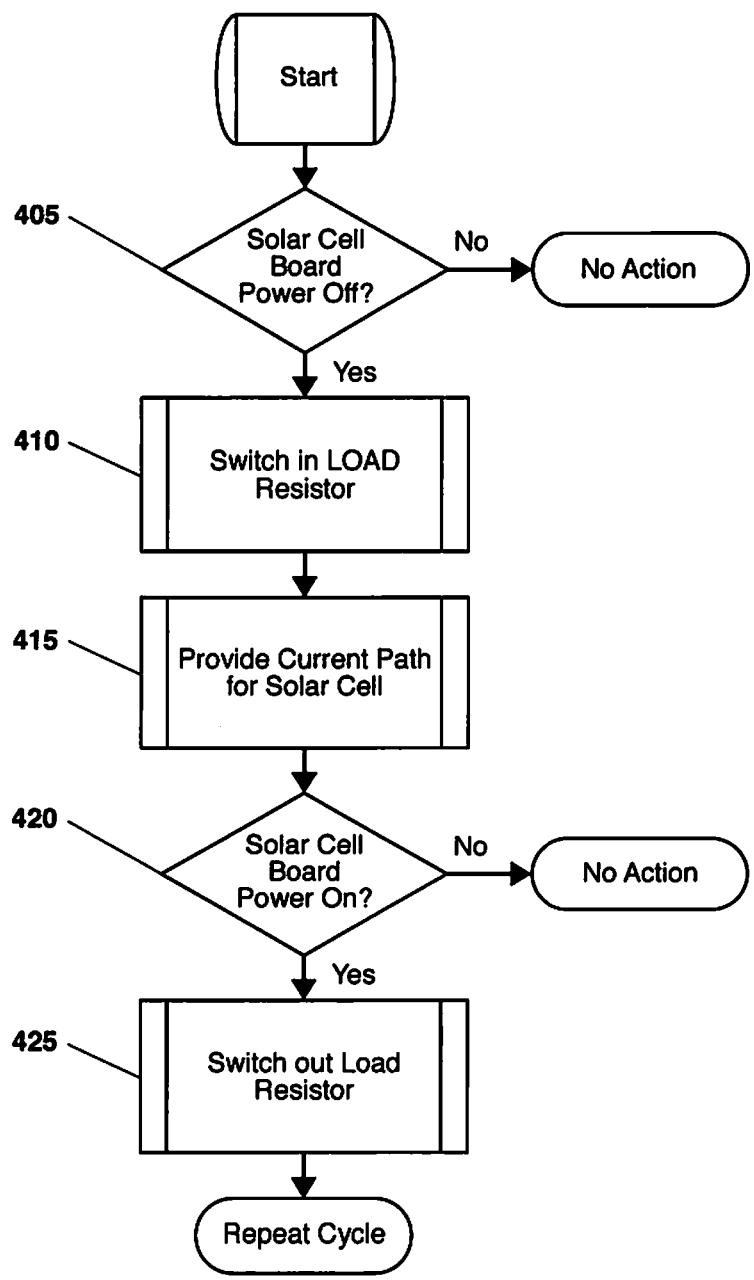

METHOD AND APPARATUS FOR IN-SITU HEALTH MONITORING OF SOLAR CELLS IN SPACE

RELATED U.S. APPLICATION

This application is a continuation-in-part of Application 061011.00030 Ser. No. 12/570,742 filed Sep. 30, 2009 and Issued on Apr. 17, 2012 as U.S. Pat. No. 8,159,238.

FIELD

The present invention generally relates to a method and an apparatus to monitor solar cells, and more particularly, to a method and apparatus to perform in-situ health monitoring of solar cells in space.

BACKGROUND

Generally, unmanned orbital craft use in-situ or in place health monitoring of solar cells. However, bus circuitry in satellites, for example, does not account for in-situ health monitoring of solar cells in the satellite. The bus circuitry of the satellite generally includes dual analog to digital converter (AD) channels and a switchable 28 volt power supply. For in-situ health monitoring of solar cells, measurement of current versus voltage (I-V) curves are performed. To perform measurement of I-V curves, large, high wattage switchable resistor arrays or active current sources are used. However, the large, high wattage switchable resistor arrays or active current sources damage solar cells under test through overdriving.

SUMMARY

Some embodiments of the present invention describe an apparatus that includes an oscillator, a ramp generator, and an inverter. The apparatus includes an oscillator, an inverter, and a ramp generator. The oscillator is configured to generate a waveform comprising a low time and a high time. The inverter is configured to receive the waveform generated by the oscillator, and to invert the waveform. The ramp generator is configured to increase a gate control voltage of a transistor connected to a solar cell, and then rapidly decrease the gate control voltage of the transistor. During the low time of the waveform, a measurement of a current and a voltage of the solar cell is performed as the current and voltage of the solar cell are transmitted through a first channel and to a second channel. During the high time of the waveform, a measurement of a current of a shorted cell and a voltage reference is performed as the current of the shorted cell and the voltage reference are transmitted through the first channel and the second channel.

Another embodiment of the present invention describes an apparatus that includes an oscillator, an inverter, a ramp generator, and a solar cell string. The oscillator is operatively connected to a first set of switches and a second set of switches, and is configured to output a waveform with a low time and a high time. The inverter is operatively connected to the oscillator, and is configured to invert the waveform received from the oscillator. The ramp generator is operatively connected to the oscillator, and is configured to increase a gate control voltage of a first transistor and decrease the gate control voltage of the first transistor. The solar cell string includes a first node operatively connected to a drain of the first transistor, and a second node operatively connected to a source of the first transistor via a first resistor. When the ramp generator increases the gate control voltage of the first transistor, the solar cell string is subjected to a decreasing resistance to monitor a voltage and a current of the solar cell string.

Another embodiment of the present invention describes a method that includes generating a waveform comprising a low time and a high time. The method includes receiving the waveform from an oscillator, and inverting the waveform. The method also includes increasing a gate control voltage of a transistor connected to a solar cell, and rapidly decreasing the gate control voltage of the transistor. The method also includes measuring, during the low time of the waveform, a current and a voltage of the solar cell as the current and voltage of the solar cell are transmitted through a first channel and to a second channel. The method also includes measuring, during the high time of the waveform, a current of a shorted cell and a voltage reference as the current of the shorted cell and the voltage reference are transmitted through the first channel and the second channel.

Another embodiment of the present invention describes a method. The method includes outputting waveform with a low time and a high time, and inverting the waveform received from the oscillator. The method also includes increasing a gate control voltage of a first transistor and decreasing the gate control voltage of the first transistor. The method also includes subjecting a solar cell string to a decreasing resistance and monitoring a voltage and a current of the solar cell string by increasing a voltage of the first transistor, which is connected to the solar cell string.

Another embodiment of the present invention describes an apparatus that is configured to measure a plurality of measurement variables on two channels. The apparatus includes a clock generator configured to generate a waveform operating at one cycle per second. The apparatus also includes a ramp generator configured to increase a gate control voltage on a transistor connected to a solar cell and decrease the gate control voltage connected to the transistor. The apparatus also includes a switch configured to allow the ramp generator to increase the gate control voltage of the transistor, and to allow current and voltage measurements on the two channels, during a long period of the cycle. The switch is further configured to allow the ramp generator to decrease the gate control voltage, and to allow a shorted cell and a voltage reference to be measured on the two channels, during a short period of the cycle.

BRIEF DESCRIPTION OF THE DRAWINGS

For proper understanding of the present invention, reference should be made to the accompanying drawings, wherein:

FIG. 3 illustrates a method of measuring four variables on a solar cell board including two channels, in accordance with an embodiment of the present invention.

FIG. 4 illustrates a method for detecting when power is removed from the solar cell board, in accordance with an embodiment of the present invention.

DETAILED DESCRIPTION OF THE PREFERRED EMBODIMENTS

It will be readily understood that the components of the present invention, as generally described and illustrated in the figures herein, may be arranged and designed in a wide variety of different configurations. Thus, the following detailed description of the embodiments of an apparatus, a system, a method, and a computer readable medium, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, the usage of "certain embodiments," "some embodiments," or other similar language, throughout this specification refers to the fact that a particular feature, structure, or characteristic described in connection with the embodiment may be included in at least one embodiment of the present invention. Thus, appearances of the phrases "in certain embodiments," "in some embodiments," "in other embodiments," or other similar language, throughout this specification do not necessarily all refer to the same group of embodiments, and the described features, structures, or characteristics may be combined in any suitable manner in one or more embodiments.

Embodiments of the present invention provide a method and an apparatus configured to perform in-situ measurements of test solar cell operational parameters on orbit using high temperature and high ionizing radiation tolerant electronic components. Measurement of solar cell current versus voltage (I-V) curves generally use a four-wire, or Kelvin measurement circuit. In the Kelvin measurement circuit for a solar cell string, two wires connect to a positive terminal of the solar cell string and two wires connect to the negative terminal of the solar cell string. One pair of wires is chosen to pass the current flowing from the solar cell string as it is loaded, while another pair is used such that little or no current flows through. The other pair is used to measure the voltage across the solar cell string as it is loaded. To achieve an I-V curve, a resistive load across the solar cell string is adjusted from little or no current flowing to near maximum current flowing. As sweeping occurs, the current flowing through the solar cell string and the voltage across the solar cell string are measured to create data pairs of current versus voltage of the solar cell.

Figure 1:
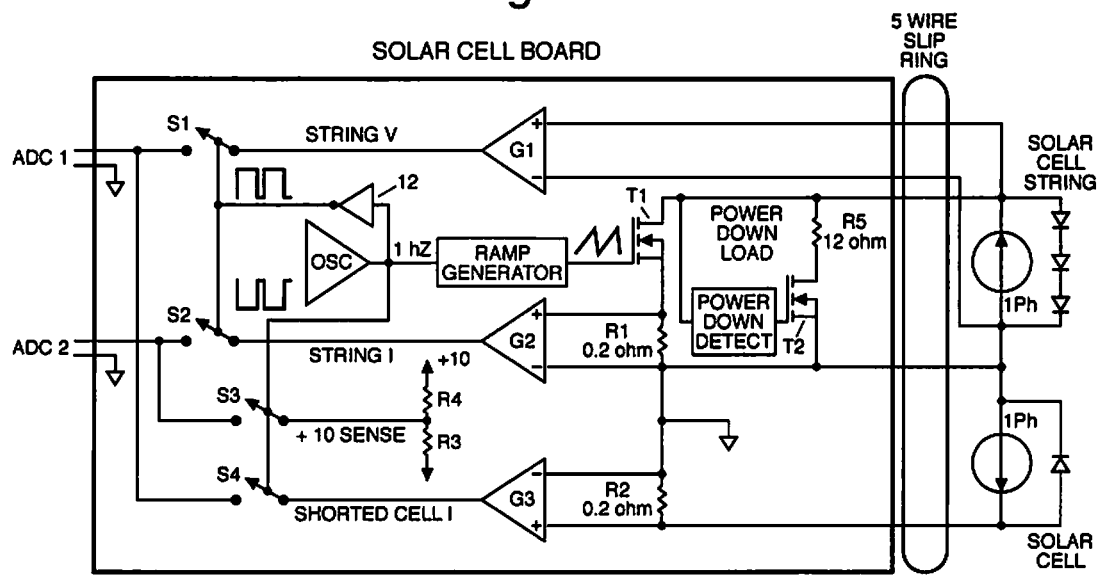
FIG. 1 illustrates a solar cell board, in accordance with an embodiment of the present invention.

FIG. 1 is a block diagram illustrating a solar cell board 100, in accordance with an embodiment of the present invention.

The solar cell board 100 includes an oscillator (OSC) disposed near a center of the board 100. The OSC, however, is not restricted to the center of the board, but can be disposed at any location on the board based on the configuration of the board. The OSC may be known as the heartbeat or pulse of the system.

In this embodiment, the OSC outputs a waveform to an inverter 12, a ramp generator, and to a set of switches S3, S4. The waveform may operate at 1 cycle per second I-V curve. It should be noted, however, that the OSC is not restricted to outputted 1 Hz, but can output a frequency higher or lower than 1 Hz depending on the configuration of electrical components in the solar cell board 100 and/or solar cell string (to be later described). In this embodiment, the outputted waveform also has a low period of approximately 880 milliseconds (mS) and a high period of approximately 120 milliseconds (mS). A person of ordinary skill in the art would appreciate that the periods may vary.

The inverter 12 receives the outputted waveform and generates an inverted waveform with a high period of 880 mS and a low period of 120 mS. During the high period of the inverted waveform, a processor (not illustrated) performs measurement of the current versus voltage of the solar cell. The processor can be outside of the solar cell board, or could be configured to be embedded on the solar cell board. During the low period of the inverted waveform, the processor measures a current of a shorted solar cell and a 10 volt bus.

At the same time, the ramp generator receives the waveform and generates a ramp to slowly increases voltage over the low period of the non-inverted waveform and then quickly decreases the voltage over the high period of the non-inverted waveform. In other words, the ramp generator creates a saw tooth wave that slowly increases voltage followed by a rapid decrease in voltage. The saw tooth wave is applied to the gate of an n-channel enhancement mode metal-oxide-semiconductor field-effect transistor (MOSFET, MOS-FET, or MOS FET) T1. As voltage on the gate of MOSFET T1 becomes more positive in regards to its source, which is tied to a 0.2 ohm resistor R1, the resistance of the channel decreases. For example, when the voltage to the gate is increased from approximately zero 0 volts to some threshold level of MOSFET T1, the resistance of the channel reduces to thousandths of an ohm. The threshold level can be, for example, 6.24 volts, which is adequate to turn MOSFET T1 completely on.

The generation of the saw tooth wave by the ramp generator allows for a channel resistance of MOSFET T1 to be conducted by sweeping the channel resistance from a very high resistance to a very low resistance. The sweeping of the channel resistance causes a variable resistance to take place. Because channel resistance is being conducted, MOSFET T1 can be called a variable resistor.

The embodiment shown in FIG. 1 also includes a solar cell string. A top node of the solar cell string is tied to a drain of MOSFET T1. A bottom node of the solar cell string is tied to the 0.2 ohm resistor R1, which is tied to the source of MOSFET T1. By tying the solar cell string to MOSFET T1, the solar cell string can be subjected to an ever decreasing resistance as the ramp generator slowly increases the voltage to a gate of MOSFET T1. For example, at the beginning of the cycle, the solar cell string has as an infinite resistance because the ramp generator applies close to 0 volts to the gate. In other words, the solar cell string does not have real current flowing out of it. This condition of the solar cell string can be called an unloaded condition, a zero current condition, or an open circuit condition.

However, as voltage is increased, the solar cell string is taken through its entire load line, and all the way down to the point where MOSFET T1 is effectively shorted. At this juncture, there is about 200 milliohms across MOSFET T1, which effectively causes a short circuit. Such short circuit allows the solar cell string to be monitored from an open circuit to the short circuit. As a result, the voltage and the current of the solar cell string can be effectively monitored.

FIG. 1 also illustrates a difference amplifier G1 that receives two wires from the solar cell string. In particular, the two wires are received at a non-inverting or positive input and an inverting or negative input of the difference amplifier G1. Voltage being outputted from the difference amplifier G1 represents a difference between voltage received at the positive input and voltage received at the negative input. For example, while the ramp generator slowly increases voltage, a first analog to digital converter channel ADC1 receives String Voltage or String V conditioned by difference amplifier G1. In other words, difference amplifier G1 is constantly across the solar cell string, and represents no real load.

During the sweeping period, String V outputs the voltage coming across the solar cell string. Simultaneously, difference amplifier G2 conditions the voltage produced across the 0.2 ohm resistor R1. For example, the difference amplifier G2 provides a gain of 76.39 to the voltage across the 0.2 ohm resistor R1, and adds that voltage to an offset voltage. The gain can be dependent on the resistors in difference amplifier, and be modified to fit the solar cell current. The offset voltages are added to each of the inputs to ensure the operational amplifiers operate in their linear region. The voltage produced across the 0.2 ohm resistor R1 is analogous to, or is a function of, the current flowing out of the solar cell string as the sweep occurs. Therefore, as the channel resistance in MOSFET T1 reduces, the current from the solar cell string is increased because less impedance is coming across. Simultaneously, the voltage across the 0.2 ohm resistor R1 is increased, which is conditioned by difference amplifier G2, and travels into a second analog to digital converter channel ADC2. This allows the voltage on ADC1 (or voltage on String V) to start high and then start sweeping low, and also allows for the voltage on ADC2 (or String I or String Current) to increase at the same time. As a result, a characteristic curve of the solar cell or the I-V curve can be obtained.

FIG. 1 also illustrates two switches S1, S2 to the left of String V and String I, and two switches S3, S4 to the left of +10 Sense and shorted cell I. Switches S1, S2, S3, S4 may be electronic or analog switches. When the inverted waveform is in the high period, the switches S1, S2 are closed. When the inverted waveform is in the low period, the switches S1, S2 are open. For example, when the voltage is increased, switches S1, S2 are closed, and the two voltages of String V and String I are passed through switches S1, S2 to ADC1 and ADC2. In other words, during the long wave portion of the OSC, the voltages of String V and String I are passed through switches S1, S2 and onto ADC1 and ADC2.

In addition, when the non-inverted waveform is in the low period switches S3, S4 are open, and when the non-inverted waveform is in the high period switches S3, S4 are closed. Switches S3, S4 are closed because the voltage is no longer being increased to the gate of MOSFET T1. Also, because switches S3, S4 are closed, the voltage reference and the current of the shorted cell can be measured.

Therefore, the switches illustrated in FIG. 1 allow for time-multiplexing to occur to determine which measurements are to be performed on ADC1 and ADC2.

In this embodiment, a solar cell is also connected to the board, and is tied to a 0.2 ohm resistor R2. A difference amplifier G3 is connected to the 0.2 ohm resistor R2, and outputs to ADC1 a voltage coming across the 0.2 ohm resistor. Thus, when the period from the OSC is high, the solar cell is shorted. The shorted solar cell provides a representative cell that is under continuous electrical load, and is not swept through an I-V curve. The measurement of the shorted solar cell provides information to those monitoring the health of the cells different to, but no less important than, that associated with the swept cell. This allows for redundancy measurements of the values of the representative cell, i.e., the solar cell string, and the shorted solar cell to be compared. In other words, the shorted cell measurement is a measurement that provides an additional component of health information with respect to the solar cell. In this embodiment, the shorted cell is in a shorted condition, while the solar cell string is in one of three states: (1) being swept through the IV curve, (2) in an open circuit condition, or (3) being loaded by RLOAD in the power down state.

The board also includes a +10 Sense voltage divider tied to ADC2. +10 Sense divides, for example, 10 volts into half by using two resistors R3, R4. However, the amount of voltage to be divided may vary depending on the range of ADC1 and ADC2. In this embodiment, +10 Sense is configured to monitor for bias current, voltage supply, and open circuit and/or short circuit measurements to determine the change in measurement. In other words, +10 Sense can be used for health measurement verification as a function of a properly regulated on board power and voltage reference system.

+10 Sense can also be used as excitation and reference voltages to keep operational amplifiers near the most linear operational region. +10 Sense can also determine whether the 10 volts are drooping by the comparing the 10 volts to the measurements taken on the solar cells. In this embodiment, the 10 volts are generated using two regulators (described below) from a 28 volt power supply of the aircraft bus. This allows for +10 Sense to monitor the two regulators generating the 10 volts. If a change in voltage exists, and it has same periodicity as the solar cell measurement with the error, then the change in solar cell measurements can be easily attributed to the power supply. This allows for any uncertainty that resides in the measurement of 10 volt power supply to be removed, as well as any uncertainty with excitation and bias voltages to be removed.

The board also includes a power down load. In this embodiment, when power is removed from the system, the solar cell string under test should be continuously driven. In other words, the solar cell string should include some load when the power is removed from the system. To ensure that the solar cell string is continuously loaded, a 12 ohm resistor R5 is used to provide a load when the power goes out of the system. The 12 ohm resistor R5 is also used because 12 ohms is the nominal load, and includes about the same stress as the other solar cells that power the aircraft.

In this embodiment, the solar cell board also uses a power down detect such that, when power is removed from the circuit board, the solar cell string is configured to use the power down circuitry to turn on MOSFET T2, which provides a circuit in the power down mode. The circuit is the solar cell string tied across the 12 ohm resistor. Because this embodiment provides representative cells and strings in an array, which are constantly monitored for health, the life-time of the actual array, which is creating power for the space craft, can be predicted. Thus, the 12 ohm resistor maintains the power of the solar cell string at a power point at which the other solar cells powering the aircraft are operating at. Because the solar cell string, under test, ages at the same rate as the other solar cells, the solar cell string should be subjected to the same stresses as the other solar cells in the array. In other words, because the rest of the solar cells in the array are always powering the aircraft or are always under load, the solar cell string should also be powered or under the same load.

Therefore, the solar cell board illustrated in FIG. 1 provides an inexpensive, radiation and thermally hard all analog system that is autonomous and is simple and reliable.

Figure 2A:
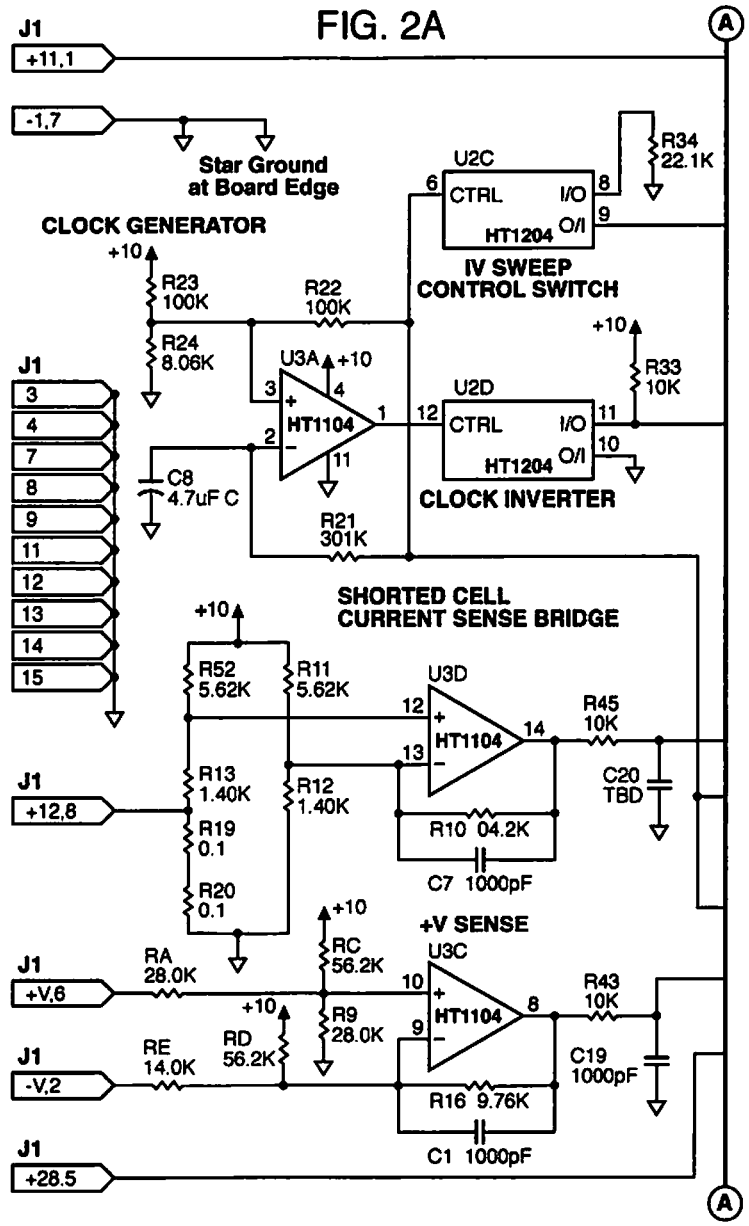
FIG. 2 illustrates the solar cell board, in accordance with another embodiment of the present invention.
Figure 2B:
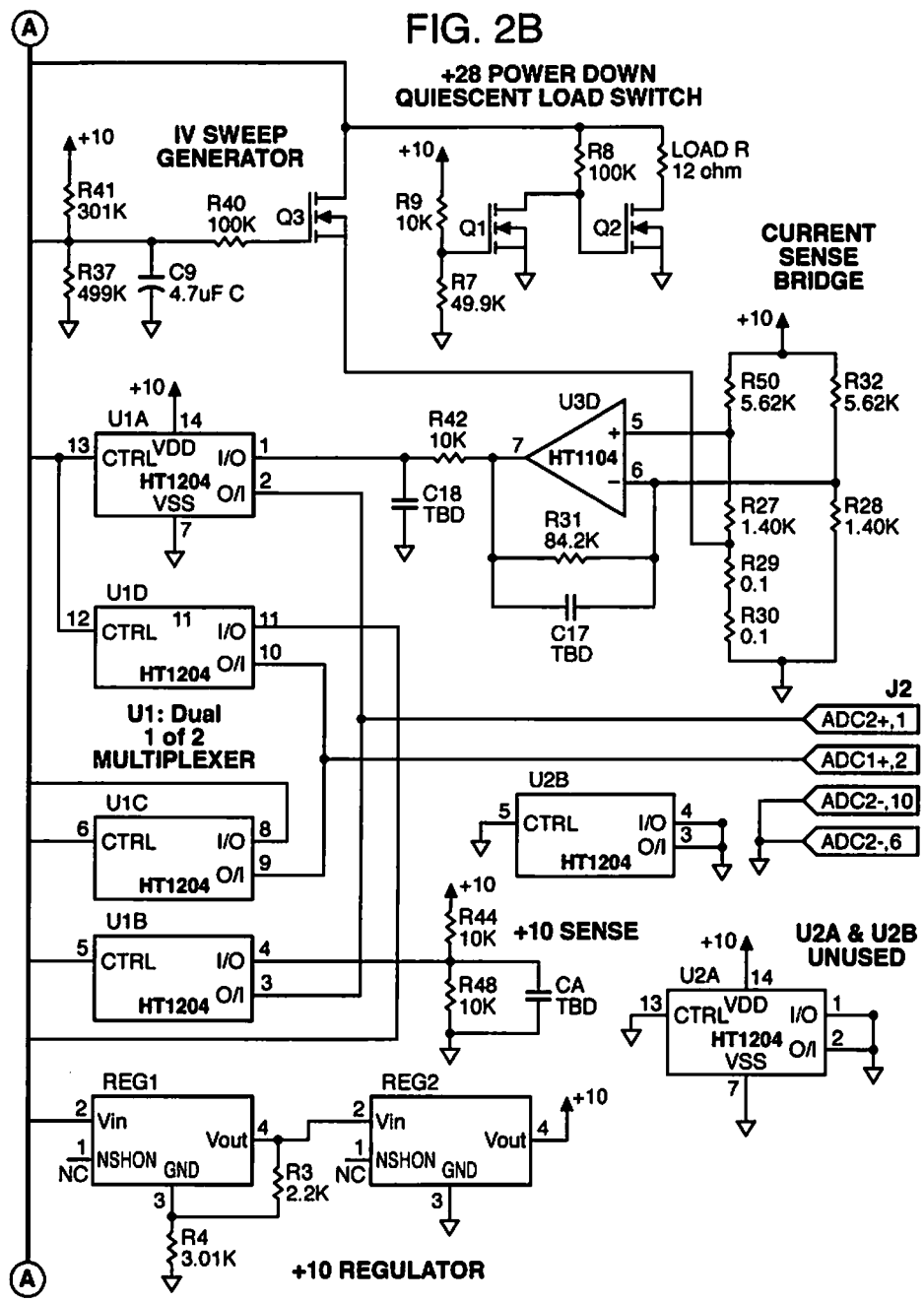

FIG. 2 illustrates a solar cell board in accordance with another embodiment of the present invention. The solar cell board in FIG. 2 includes a clock generator, a clock inverter, an IV sweep control switch, dual multiplexors, a current sense bridge, a shorted cell current sense bridge, a +V sense, a +10 regulator, a +10 sense, and a +28 power down quiescent load switch.

The solar cell board shown in FIG. 2 is designed to solve the problem of measuring four measurement variable using two analog to digital converter (AD) channels. The board includes two different modes. The first mode measures the current versus voltage (I-V) curve simultaneously. The second mode measures a shorted cell's current and a 10 volt bus through a +10 sense voltage divider.

To achieve the four measurements, time-domain multiplexing is used to multiplex through time between the two sets of measurements. To time-multiplex, a relaxation oscillator or a clock generator is disposed on the solar cell board.

The oscillator comprises an operational amplifier U3A, resistors R23, R24, R22, R21, and a capacitor C8 to provide a time-base for measurement sweeps on the solar cell board. The oscillator's frequency is outputted at approximately 1 Hz, and is asymmetrical with a low time of about 880 mS and a high time of 120 mS. The oscillator outputs a low period during the low time of about 880 mS at which time the I-V curve is measured. The oscillator also outputs a high period during the high time of about 120 mS at which time measurement of shorted cell's current and voltage reference (e.g., +10 Sense) is performed.

When the output of the oscillator is high at pin 12, the output of switch (or clock inverter) U2D at pin 11 is low. In other words, when the output to pin 12 is high, pins 10 and 11 are shorted via switch U2D to tie pin 11 to pin 10. Essentially, the shorting of pins 11 and 10 causes pin 11 to be tied to ground of pin 10. Also, when the output of the oscillator to pin 12 is high, measurement of the shorted cell and +10 sense can be performed during the high time of 120 mS, while measurement of the I-V curve is disabled. To allow measurement of the shorted cell and +10 sense, switch U1C is turned on through pin 6, and switch U1B is turned on through pin 5.

However, when the oscillator's output at pin 12 is low, pin 11 is disconnected from pin 10, and is connected to positive 10 volts via 10K resistor R33. This allows pin 11 of the clock inverter to be tied to pins 12, 13 of switches U1D, U1A. Thus, when the oscillator's output at pin 12 is low, the clock inverter generates an inverted waveform that has a high period of 880 mS and a short period of 120 mS. The generation of the inverted waveform allows for measurements of the current and the voltage of the solar cell to be performed.

In this embodiment, through the operation of using the clock generator and the clock inverter, the four signals can be multiplexed onto the two AD channels. In particular, switches U1A, U1B, U1C, U1D allow multiplexing of four different measurements onto the two AD channels. The clock generator and the clock inverter can be used as the control signals for the multiplexing. The clock generator can also be used as a time-base for when voltage is generated and applied to a gate of a MOSFET Q3 as the variable load. This is accomplished by a 100K resistor R40 at the gate of MOSFET Q3, a capacitor C9, and a voltage divider R41, R37.

For example, when the output of the clock generator is low for approximately 880 mS, pins 8, 9 of sweep control switch U2C are disconnected. This allows voltage divider (or resistors) R41, R37 and the capacitor C9 to generate a voltage to the gate of MOSFET Q3. The generating of the voltage allows for a ramp to be generated. For example, 2 volts are generated and applied to the gate of MOSFET Q3 at the start of the 880 mS sweep window. The 2 volts is a maximum voltage to turn off MOSFET Q3. During the 880 mS sweep window, voltage applied to the gate is slowly increased to an upper voltage which exceeds a worst case threshold of MOSFET Q3. For example, a voltage is increased to about 6.24 volts, which is adequate to turn MOSFET Q3 completely on.

In this embodiment, the voltage is increased to about 6.24 volts with a time constant based on voltage divider R37, R41 and capacitor C9. The time constant is a resistor-capacitor (RC) time constant. The RC time constant is a resistance of the RC circuit multiplied by a capacitance of the RC circuit. This time constant characterizes the rise time of the voltage of the RC circuit. For example, the time constant is the capacitance of capacitor C9 multiplied by a parallel combination of resistors R37 and R41. The resistance of the RC circuit is the parallel combination of resistors R37 and R41, which is the Thevenin equivalent resistance of the RC circuit.

Because five times the time constant allots for a time period of 880 mS, the charge to the gate of MOSFET Q3 is to be increased slowly during the clock generator's low time. This allows the gate to source voltage (VGS) to vary such that the turn on voltage of MOSFET Q3, which varies the channel resistance of MOSFET Q3, provides a variable load to perform a solar cell I-V sweep. It should be noted that during the low period of 880 mS, the voltage is slowing being increased through the capacitor's charging time.

Voltage dividers R41, R37 and capacitor C9 can also generate a voltage low enough to turn MOSFET Q3 off. For example, when the output at pin 12 of the clock generator is high, pin 6 of switch U2C is at high, and pin 9 of switch U2C is connected, via pin 8 of switch U2C, to a 22.1K resistor R34. This allows the voltage of the gate of MOSFET Q3 to rapidly decrease to a set point, which is below the turn on point of MOSFET Q3. Also, 22.1 K resistor R34 is placed across capacitor C9 to ensure that C9 discharges to a lower voltage or approximately 0 volts during the 120 mS period. For example, the lower voltage is 0.65 volts, which can be determined by the supply voltage across the voltage divider provided by resistor R41 in series with the parallel combination of resistors R37 and R34. The rate of the decreasing voltage is provided by the time of the low period of the oscillator and the RC time constant of the circuit, where the resistor R is the parallel combination of resistors R41, R37 and R34, and the capacitor C is C9. This lowers the resistor R of the RC time constant, which greatly decreases the time constant. The time constant can be reduced by a factor of 9.5, which means that the discharge time of the cap will be 9.5 times less than it's charge rate. The smaller time constant makes up for the discharge period of the oscillator's waveform (e.g., the high period), which is less than the charge period of the oscillator waveform (e.g., the low period).

As such, the above-mentioned clock generator provides a gate turn on voltage for MOSFET Q3, which provides a variable load for the measurement of the I-V curve. The gate control voltage for MOSFET Q3 is developed across capacitor C9. For example, the clock generator dictates when capacitor C9 charges up through the voltage divider R41, R37, and when C9 discharges through the resistor divider of R41 and R34 in parallel with R37. This embodiment allows the above-mentioned process of measuring the four variables to be carried out every 1 cycle per second.

As the load is varying during the I-V sweep, a drain of MOSFET Q3 is connected to a positive current carrying input or lead J1 (+I1, 1) of a Kelvin connection. A source of MOSFET Q3 is tied to a node of resistors R27, R29 so the current flows down through MOSFET Q3 via the source. As the VGS is varied, the current slowly decreases with the amount of channel resistance. The current flows down through MOSFET Q3 and through current sense resistors R29, R30. Resistors R29, R30 are 0.1 ohm current sense resistors, and can vary according to the current of the solar cell. However, if a larger solar cell providing more current is employed, then a small resistor can be employed. In other words, the current from MOSFET Q3 provides a voltage input to the current sense bridge, which comprises resistor R27, R28, R29, R30, R32, R50.

The current sense bridge also comprises switch U3B and resistor R31. The current sense bridge accepts a current provided by the solar cell, and produces an offset voltage to operational amplifiers. The current sense bridge provides a gain factor of 76.4, and gives an offset of approximately 2 volts. In this embodiment, when non-linear operations at the operational amplifier are too close to either of 0 volt or 10 volt power rail, the voltage dividers and the offset are configured to move operating points away from the power rails of the operational amplifier and into a more linear region. Essentially, voltage divider R27, R50, and R28, R30 provide a bias to adjust the operating point away from ground at the inputs of the operational amplifier.

The current sense bridge can be comparable to difference amplifier G2 in FIG. 1. Essentially, the current sense bridge takes a difference in voltage between pins 5, 6. At pin 5, the voltage changes linearly with the current provided by the solar cell, which is being varied by the variable load. In other words, the voltage at pin 5 of the operational amplifier effectively changes according to the variable load. At pin 6, the voltage remains constant due to a single voltage divider with resistors that do not change in voltage. In other words, the current sense bridge takes the differences in voltage between pins 5 and 6, which is an amplified voltage proportional to the current from the solar cell.

Also, the current sense bridge includes a resistor R31 that acts for gain, and a capacitor C17 to filter output. At output of operational amplifier U3B, resistor R42 acts as a current limiting resistor to protect the circuit so excess current cannot flow into the operational amplifier or the switch. Capacitor C18 is an additional capacitor to filter or match capacitance through some cabling. Resistor R42 and capacitor C18 can be optional, as well as circuit specific.

FIG. 2 also illustrates the shorted cell current sense bridge that can be a reproduction of the current sense bridge. The shorted cell current sense bridge includes resistors R52, R11, R13, R12, R19, R20, R10, a capacitor C7 (unused), and a amplifier U3D. In this embodiment, current flows into lead J1 (+I2, 8), and through resistors R19, R20, which are combined into a 0.2 ohm resistor, to generate a voltage. Resistors R52, R13 provide a bias voltage which raises the voltage at the input of pin 12 to the linear operating region of operational amplifier U3D. The voltage of operational amplifier U3D changes with the current provided through the shorted cell. It should be noted that the shorted cell does not have a variable load and, therefore, the current does not change through time and remains static. The shorted cell current sense bridge also includes a 1000 Picofarad (pF) capacitor C7 to act as a low pass filter. The shorted cell current sense bridge can be comparable to G3 of FIG. 1

FIG. 2 also illustrates that the solar cell board includes a +V Sense to provide a voltage sense across the solar cell that is being measured. Lead J1 (+V, 6) and J1 (−V, 2) are lines from the Kelvin connection that carry a very small amount of current. In this embodiment, the Kelvin connection provides a four lead connection. Two leads being voltage sense leads that carry very small amount of current, and does not change in voltage.

The other two leads are current sense leads that carry all of the current. A return current path of lead (−I, 7) through star ground at a board edge, and lead J1 (−V, 2) is connected to the return current path of lead (−I, 7) that has a non-current carrying path, which is part of the Kelvin connection. Lead J1 (−V, 2) is non-current because lead J1 (−V, 2) has a higher impedance than the return current path of lead (−I, 7).

+V Sense circuit includes resistors RA, RB, RC, RD, RE, R18, a capacitor C1, and an operational amplifier U3C. Capacitor C1 provides a low pass filter in the circuit. The resistors provide a voltage bias with a 2 volt offset, i.e., two volts off of ground, similar to the current sense bridge. However, the resistors in the +V Sense are in series due to the nature of measuring the voltages. +V Sense is also a difference amplifier similar to difference amplifier G1 in FIG. 1. In particular, +V Sense measures a difference between the lead J1 (+V, 6) and lead J1 (−V, 2). The resistors in +V sense act as a bias to add 2 volts to every voltage measurement. For example, 2 volts can be added via resistors RD, RE, as well as add 2 volts to −V voltage, which will be near or approximate ground of the solar cell. Further, the same 2 volts can be added via resistors RC, RB, RA. This allows for measurements in the difference between the positive voltage of the solar cell and the negative voltage of the solar cell to be obtained. From the difference, a gain of 1.867 is provided to the measurement by a combination of resistors R18, RD, RE. Other operational amplifiers provide a gain in a similar manner.

In sum, +V sense measures the difference between the positive and negative voltage with a 2 volt offset being added to move the operational amplifier U3C into a linear operating region. Also, operational amplifier U3C is provided with a gain by multiplying the voltage by a factor of 1.867. The gain factors can be varied by changing the resistor values based on the voltage that are to be measured, i.e., the voltage of the solar cell. For example, if the voltage of the solar cell is lower, more gain can be added to provide a better resolution, but if the voltage of the solar cell is larger, the gain values can be reduced by adding smaller resistance components.

FIG. 2 also illustrates a +10 Sense circuit that senses the 10 volt power supply, and comprises resistors R44, R48 with a possible capacitor CA to be employed if a low pass filter is to be added. In this embodiment, measurement of 10 volts sense is achieved by providing a voltage divider having two equal resistance values. The voltage divider comprises 10K resistors R44, R48. Because the resistance values of resistors R44, R48 are equal, 5 volts should be measured at the center of resistors R44, R48. And, when the voltage is sampled, and when the center of resistors R44, R48 are at 10 volts, it can be determined that the 10 volt power supply is at 10 volts. If, for example, the voltage moves to 4.8 at the center of R44, R48, then it can be determined that the power supply changed by some factor. Because the resistance values do not change, the power supply can be monitored. By measuring power supply, it can be determined whether any of the 2 volt offset have changed, as well as determine how much change can be expected in the amplifier circuits based on the change in the 2 volt offsets.

FIG. 2 illustrates switches U2A, U2B as extra switches that are not used. FIG. 2 also illustrates a +10 volt regulator powered by two 10 volt regulators REG1, REG2 to generate 10 volts out of a 28 volt aircraft bus. In this embodiment, Regulator REG1 has an output at or around 15 volts, and Regulator REG2 is configured to decrease the voltage output in REG1 to 10 volts. In other words, Regulators REG1, REG2 are linear regulators that are configured to generate 10 volts.

The embodiment illustrated in FIG. 2 also includes a +28 power down quiescent load switch, which is comparable to the power down mode shown in FIG. 1. The switch includes resistors R9, R7, R8, LOAD R, and MOSFETs Q1, Q2. The switch applies a load across the solar cell when a power is taken away, and when the solar cell is not being measured. The load being applied should be powered by a 12 ohm load resistor LOAD R.

For example, when there is no +10 volt power supply, gate of MOSFET Q1 connects to ground to turn MOSFET Q1 off. When MOSFET Q1 is off, the gate of MOSFET Q2 is allowed to float. Because the gate of MOSFET Q2 is tied through R8 to the top of the solar cell, a positive voltage is provided at the gate of MOSFET Q2. And, as a result, a positive voltage is provided to VGS of MOSFET Q2 which turns MOSFET Q2 on providing a current path for the solar cell through load resistor LOAD R to ground. In other words, as +10 volt goes away, MOSFET Q2 is turned on, providing a current path through load resistor LOAD R.

However, when the +10 volt turns on, MOSFET Q1 turns on, which turns MOSFET Q2 off. For example, when MOSFET Q1 turns on, a positive voltage at the gate of MOSFET Q1 is provided at approximately 8 volts to VGS of MOSFET Q1. As a result, the gate of MOSFET Q2 is effectively shorted by placing the gate of MOSFET Q2 to ground and setting the VGS of MOSFET Q2 to 0 to turn MOSFET Q2 off, i.e., taking the load resistor LOAD R off the circuit.

Therefore, the embodiments described above with respect to FIG. 2 allows the I-V curve to be generated when the power is on, and to load the solar cell to monitor the life degradation while the power is off.

FIG. 3 illustrates a method of measuring four variables on a solar cell board including two channels, in accordance with an embodiment of the present invention.

At 305, a frequency (or waveform) at 1 cycle per second is generated by an oscillator with a low period of approximately 880 mS and a high period of approximately 120 mS. At 310, an inverter receives the frequency from the oscillator and inverts the frequency to have an inverted high period of 880 mS and an inverted low period of 880 mS. At 315, when the frequency outputted at the oscillator is low, a first set of switches are closed, and a second set of switches are opened. The opening of the first set of switches allows measurements of the current and voltage of the solar cell to be performed. At 320, a ramp generator receives the generated frequency and gradually increases voltage of a MOSFET over the low period of 880 mS. In this embodiment, the voltage is increased to a MOSFET threshold of 6.24.

At 325, when the frequency outputted by at the oscillator is high, the first set of switches are open and the second set of switches are closed. This allows for a current of a shorted cell and a reference voltage to be measured. At 330, the ramp generator receives the generated frequency, and decreases the voltage of the MOSFET over a high period of 120 mS. In this embodiment, the voltage is decreased to approximately 0 volts, sufficient to turn off the MOSFET.

Stated another way, the above-described embodiment shown in FIG. 3 provides a method to quickly and efficiently measure four variables onto two channels. For example, during the 880 mS of the waveform, the current and voltage of the solar cell is measured by increasing voltage of the MOSFET. During the 120 mS of the cycle, the voltage reference and the current of the shorted cell is measured as the voltage to the MOSFET is rapidly being decreased. The switches are used to time-multiplex between the measurements being performed.

FIG. 4 illustrates a method for detecting when power is removed from the solar cell board, in accordance with an embodiment of the present invention. At 405, a determination is made as to whether power is supplied to a solar cell board by a 10 volt power supply. If power is supplied, then a +28 power down load switch does not take any action. However, if power has been withdrawn, a 12 ohm Load R resistor is switched in through a use of a MOSFET at 410. At 415, a current path for a solar cell is provided through the 12 ohm Load R resistor, and the MOSFET of the +28 power down load switch. At 420, the +28 power down load switch determines as to whether the solar cell board is powered by the 10 volt power supply. If the 10 volt power supply is not powering the solar cell board, then the 12 ohm load R resistor continues to stay in the current path. However, if the 10 volt power supply is powering the solar cell board, then the MOSFET of the +28 power down load switch is turned off, and the 12 ohm Load R resistor is switched out of the solar cell current path at 425.

Stated another way, the above-described embodiment shown in FIG. 4 allows a load to be applied to the solar cell to effectively monitor the life degradation of the solar cell when the 10 volt power supply is not powering the solar cell board.

The method steps performed in FIG. 3 and FIG. 4 may be performed by a computer program product, encoding instructions for the nonlinear adaptive processor to perform at least the method described in FIG. 3 and the method described in FIG. 4, in accordance with an embodiment of the present invention. The computer program product may be embodied on a computer readable medium. A computer readable medium may be, but is not limited to, a hard disk drive, a flash device, a random access memory, a tape, or any other such medium used to store data. The computer program product may include encoded instructions for controlling the nonlinear adaptive processor to implement the method described in FIG. 3, and the method described in FIG. 4, which may also be stored on the computer readable medium.

The computer program product can be implemented in hardware, software, or a hybrid implementation. The computer program product can be composed of modules that are in operative communication with one another, and which are designed to pass information or instructions to display. The computer program product can be configured to operate on a general purpose computer, or an application specific integrated circuit ("ASIC").

A person of ordinary skill in the art would appreciate that the above described embodiments can be modified to provide two I-V sweep systems, or a system which time multiplexes a number of measurement pairs onto two analog to digital conversion channels. For example, a person of ordinary skill in the art would appreciate that n measurements can be time multiplexed onto the two channels by creating a complex waveform generator, i.e., a binary counter with a demultiplexer, and thus be able to measure n variables once per cycle.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

Figure 5:
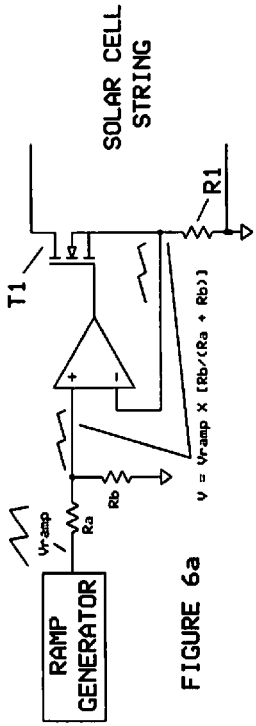
FIGS. 5-8b represent alternative embodiments.
Figure 6B:
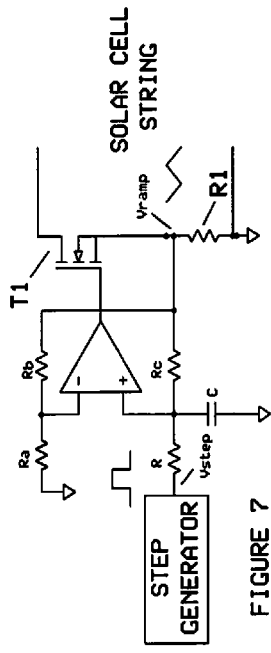
Figure 6A:
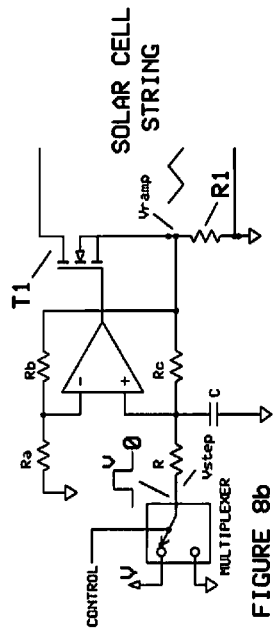

Further, the MOSFET T1 can be embedded within the feedback loop of an operational amplifier (FIG. 5). A person of ordinary skill in the art will recognize the circuit in FIG. 5 as an embodiment of a current source. Further, a person of ordinary skill in the art will recognize that a current source so placed will have the solar cell under load functioning as its own compliance voltage source. In such a configuration, the instantaneous voltage produced by the ramp generator shall be reproduced across the current sense resistor R1, within the capacity of the solar cell under load. In this manner, the electrical transfer function and associated thermal properties of MOSFET T1 are effectively removed from the operation of the circuit and the relationship between the ramp voltage and the voltage across R1 is one to one. This one to one relationship may be changed to other ratios as necessary by adding voltage attenuation or amplification to the ramp voltage as deemed necessary to match the characteristics of the solar cell or solar cell string under test (FIGS. 6a and 6b). In FIG. 6a, the attenuation of the ramp is given by the equation $V=Vramp \times [Rb/(Ra+Rb)]$, though other means of attenuation are possible. In FIG. 6b, a form of amplification is illustrated whereby the ramp voltage across R1 is given as Vramp X [1+(Ra/Rb)]. The ramp generator in FIG. 2 and described above produces a ramp function with exponentially shaped edges. In all examples, the ramp generator may be replaced by an analog signal generator of any sort or may be replaced by an analog to digital converter under software control.

Figure 7:
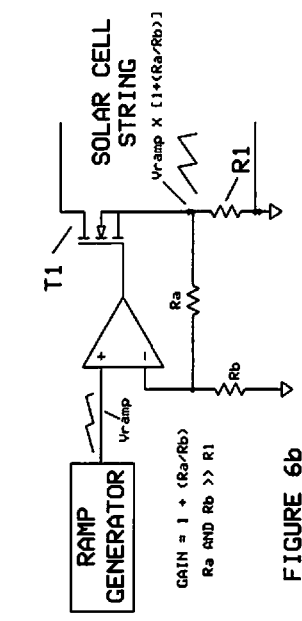

If a linear ramp is desired, the circuit in FIG. 5 may be modified to that of FIG. 7 which is recognizable to a person of ordinary skill in the art as a utilization of a Howland current pump, in the configuration of a DeBoo integrator. In the circuit of FIG. 7 the MOSFET T1 is now placed within the feedback loop of the DeBoo integrator in the same manner as MOSFET T1 was placed within the feedback loop of the circuit of FIG. 5 and operates in the same fashion as described above. The use of the DeBoo integrator allows a step voltage applied to the input of the circuit in FIG. 5 which then will be integrated by the circuit, resulting in a linear current ramp drawn from the load (solar cell). Typically, in practice, R=(Ra×Rb)/Rc and so the current into capacitor C=Vstep/R. As a function of time, $$V\text{ramp}=[1+(Rb/Ra)]/[R\times C]\times \int_0^T V\text{step}\, dt$$

Figure 8A:
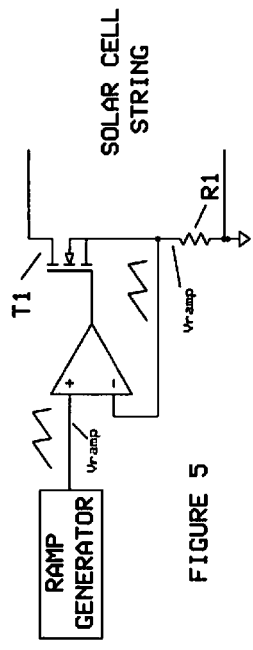

This Vstep may be set at a particular voltage V for a given application, and a simple example is given in (FIG. 8a). In FIG. 8a, a MOSFET T2 is utilized to discharge C when the gate voltage on T2 Vgate is above the gate threshold voltage for T2, that is T2 is on. Thus Vramp is forced to and held to ground or 0 volts as long as Vgate is above the gate threshold value for T2. When Vgate is taken below the threshold voltage of T2, T2 is off and V is the input to the DeBoo integrator and Vramp follows the equation above for Vramp. T2 represents a switch and its function may be realized in a number of fashions.

Figure 8B:
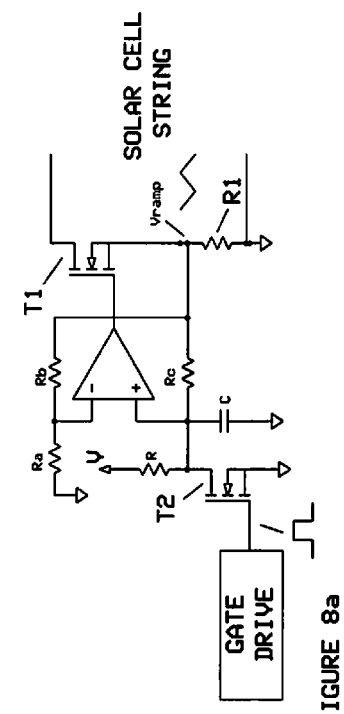

Another realization of a single voltage V input configuration may be constructed as in FIG. 8b where an analog multiplexer is used to switch Vstep between V and ground or 0 volts through the addressing signal CONTROL. A person of ordinary skill in the art can envision that through the use of a multiplexer, more than one value of V may be chosen from in an application appropriate to the characteristics of any one of a number of different loads. The various voltage steps may be selected by the multiplexer from an a priori set of voltages created by a voltage divider or any other means. Further, the various voltages may be generated by an analog to digital converter.

We claim:

1. An apparatus, comprising:
   a solar cell or solar cell string isolated for in-situ testing and measurement;
   a metal oxide semiconductor field effect transistor connected to said solar cell or solar cell string;
   a time variant excitation voltage to change a gate control voltage of said metal oxide semiconductor field effect transistor thus sweeping the channel resistance over its entire range; and
   wherein a measurement of a current and a voltage of said solar cell or solar cell string is performed as the current and voltage of the solar cell or string are transmitted through a first channel and to a second channel of the solar cell board.

2. The apparatus of claim 1, further comprising an operational amplifier circuit having a feedback loop, wherein the first metal oxide field effect transistor is placed within the feedback loop of the operational amplifier circuit configured as a current pump, such that the time variant excitation voltage is recreated across the solar cell or string current sense resistor as a voltage equal to the product of solar cell or string output current and the sense resistor.

3. The apparatus of claim 1, wherein the time variant excitation voltage is either attenuated or amplified by the transistor and operational amplifier circuit as desired to match the time variant excitation voltage range to solar cell or string output range characteristics.

4. The apparatus of claim 1, wherein the current pump configuration is modified to include a linearizing integration function to convert the discharging of a capacitor in a time variant excitation voltage generator into a ramp which will recreate across a solar cell string current sense resistor as the product of the solar cell or string output current and the sense resistor.

5. The apparatus of claim 3, wherein the excitation voltage generator is a step generator of any kind and of any voltage whereby the integration function within the circuit construct integrates the step into a ramp which will recreate across a solar cell string current sense resistor as a voltage analogous to solar cell or string output current.

6. The apparatus of claim 4, wherein a multiplexor is used for random selection from multiple voltage values which may be delivered to the apparatus such that for differing conditions, for example, different solar cells or strings with unique current delivery capacities, unique step voltages may be selectively applied.

7. The apparatus of claim 1, wherein the time variant excitation voltage producing source is a digital to analog converter controlled by any processing element to include a microcontroller, counter, other.

* * * * *